(12) United States Patent
Rey-Losada (10) Patent No.: US 8,803,602 B2
(45) Date of Patent: Aug. 12, 2014

(54) COMMON MODE BIAS CIRCUIT

(75) Inventor: Daniel Rey-Losada, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 84 days.

(21) Appl. No.: 13/543,040

(22) Filed: Jul. 6, 2012

(65) Prior Publication Data

US 2014/0009223 A1    Jan. 9, 2014

(51) Int. Cl.
*H03F 3/45*    (2006.01)

(52) U.S. Cl.
USPC .............................. 330/69; 330/261

(58) Field of Classification Search
USPC ..................... 330/69, 116, 261, 301
See application file for complete search history.

(56) References Cited

U.S. PATENT DOCUMENTS

| | | | | |
|---|---|---|---|---|
| 6,075,413 A * | 6/2000 | Katakura | ...................... | 330/261 |
| 6,366,162 B1 | 4/2002 | Angell et al. | ................. | 327/563 |
| 7,336,129 B2 * | 2/2008 | Pan | ............................... | 330/261 |
| 7,605,658 B2 * | 10/2009 | Meninger | ..................... | 330/261 |
| 7,642,816 B2 * | 1/2010 | Kuo et al. | ..................... | 327/103 |
| 2006/0033573 A1 | 2/2006 | Yano et al. | .................... | 330/284 |
| 2006/0226910 A1 | 10/2006 | Tanoi | ............................. | 330/296 |
| 2010/0148871 A1 | 6/2010 | Lee et al. | .................... | 330/261 |
| 2012/0044006 A1 * | 2/2012 | Kao et al. | ...................... | 327/307 |
| 2013/0033312 A1 * | 2/2013 | Lu | ................................... | 330/69 |

FOREIGN PATENT DOCUMENTS

| | | | | |
|---|---|---|---|---|
| EP | 2 037 573 A1 | 3/2009 | ............. | H03F 3/193 |
| WO | WO 96/19866 | 6/1996 | ................ | H03F 3/45 |

OTHER PUBLICATIONS

Authorized Officer Carlos Lorenzo, Notification of Transmittal of the International Search Report and the Written Opinion of the International Searching Authority, or the Declaration; PCT/US2013/048928; Dec. 20, 2013, 9 pages.

* cited by examiner

*Primary Examiner* — Khanh V Nguyen
(74) *Attorney, Agent, or Firm* — Sunstein Kann Murphy & Timbers LLP (57) ABSTRACT

A bias voltage source for a differential circuit has low output impedance at DC, but considerably higher output impedance within the frequency band of the differential signal being processed, to provide an accurate, well-matched common-mode bias voltage to each component of a differential signal path, while providing a low noise current, minimizing the conversion between common-mode and differential modes, and preserving available headroom, and all without requiring the use of large resistors.

20 Claims, 9 Drawing Sheets

| | $i^2_{n,R}$ | $i^2_{n,TOT}$ |
|---|---|---|
| Prior Art | 28.5pA²/Hz | 30.11pA²/Hz |
| Exemplary Embodiment | 14.25pA²/Hz | 15.9pA²/Hz |

| Zodc | Zosb |
|---|---|
| 1% | 500% |
| 80% | 500% |
| 1% | 20% |

Fig. 8A

| Zodc | Zosb |
|---|---|
| 1Ω | 10Ω |
| 1Ω | 1000Ω |
| 1Ω | 1MΩ |

Fig. 8B

COMMON MODE BIAS CIRCUIT

TECHNICAL FIELD

The present inventions relate to differential signal processing, and more particularly to circuits for biasing differential and pseudo-differential signal processing circuits.

BACKGROUND ART

It is known in the prior art that differential or pseudo-differential circuits have nodes that float at DC and prevent proper operation unless a method is provided to bias these nodes to a desired common mode. Therefore, it is known in the art to supply a DC bias voltage to a differential signal processing circuit, such as the inputs of an AC-coupled differential operational amplifier for example.

Figure 1A:
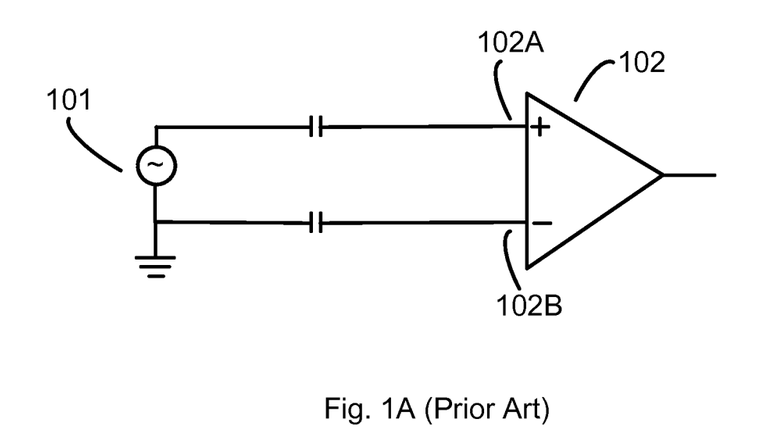
FIGS. 1A and 1B schematically illustrate prior art amplifier circuits.

For example, a differential amplifier 102 may be AC-coupled to the output of a transducer 101, as schematically illustrated in FIG. 1A. The transducer output may be a single-ended voltage signal, referenced to ground. To interface this signal to the differential amplifier 102, which may have an input common-mode different from the transducer output's common mode, the transducer output 101 is AC-coupled to the non-inverting input 102A of op-amp 102, while the inverting input 102B of the op-amp 102 is AC-coupled to ground, and both inputs are provided (not shown) with nominally identical DC bias voltages.

Figure 1B:
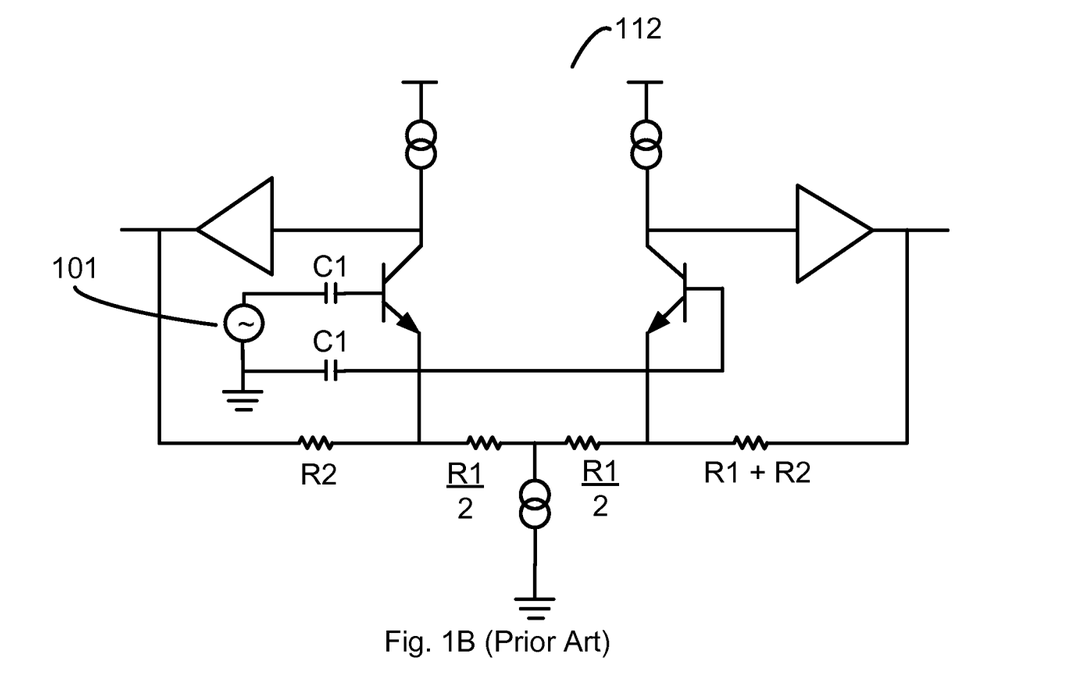

FIG. 1B schematically illustrates a differential amplifier circuit 112 similarly configured to accept the single-ended or pseudo-differential output of transducer 101, process it, and produce a differential output signal.

Figure 2A:
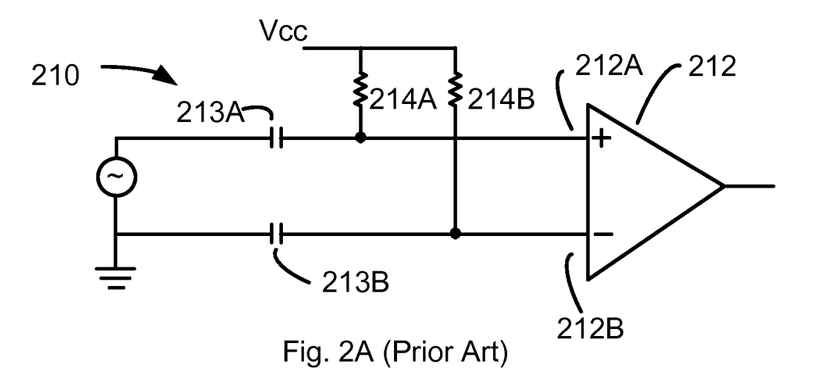
FIGS. 2A-2C schematically illustrate prior art biasing circuits, and FIG. 2D schematically illustrates a small-signal model of a prior art biasing circuit.
Figure 2B:
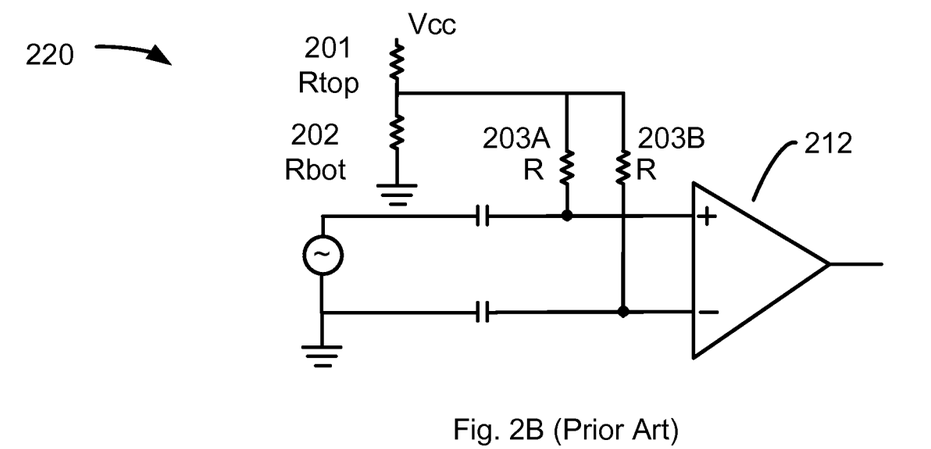
Figure 2C:
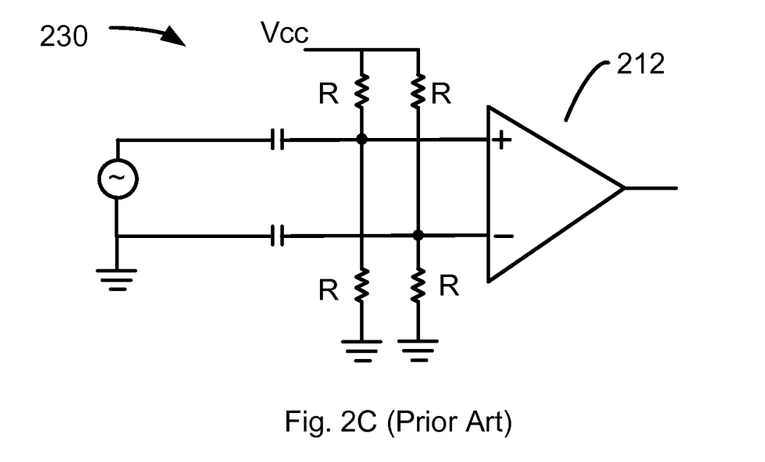
Figure 2D:
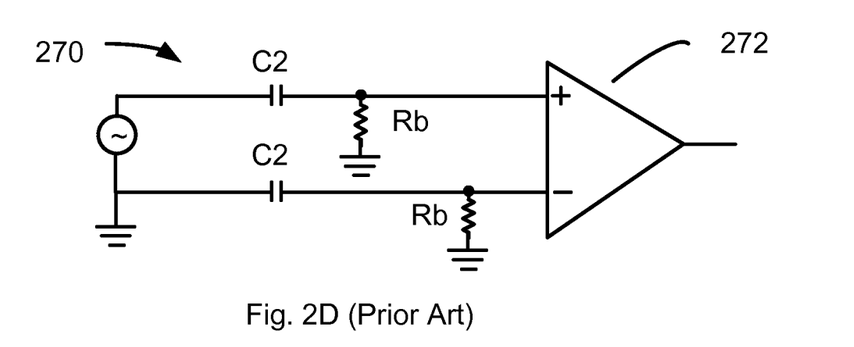

A number of biasing circuits and methods are known in the art. Two simple biasing circuits are schematically illustrated in FIG. 2A and FIG. 2B, respectively. In each case, an amplifier's inverting and non-inverting inputs are biased by coupling them to a voltage source through two biasing resistors. An alternate biasing circuit is schematically illustrated in FIG. 2C, in which an amplifier's inverting and non-inverting inputs are biased by two voltage divider circuits coupled to a voltage source. A small-signal representation 270 of such a biasing circuit is schematically illustrated in FIG. 2D.

SUMMARY OF THE EMBODIMENTS

In a first embodiment there is provided a biasing circuit for providing bias voltage to a differential circuit configured to process signals at frequencies above a pre-determined frequency within a signal band, the differential circuit having a first signal node and a second signal node, the first signal node and second signal node together forming a differential node, the biasing circuit including a bias source having a DC voltage output, the DC voltage output producing a DC bias voltage and having: a first output impedance at DC, and a second output impedance at frequencies within the signal band; a first bias resistor having a first bias resistance, the first bias resistor coupled between the voltage output and the first signal node so as to provide a DC bias voltage to the first signal node; and a second bias resistor having a second bias resistance, the second bias resistor coupled between the voltage output and the second signal node so as to provide the DC bias voltage to the second signal node, the magnitude of the first output impedance being less than 80 percent of the smaller of the magnitude of the first bias resistance and the magnitude of the second bias resistance, and the magnitude of the second output impedance being at least 20 percent of the larger of the magnitude of the first bias resistance and the magnitude of the second bias resistance, provided that the magnitude of the first output impedance is less than fifty percent of the magnitude of the second output impedance.

In some embodiments, the differential circuit is an amplifier. In some embodiments, the differential circuit is a buffer, a comparator, or a filter. In some embodiments, the differential circuit is an intermediate stage of an amplifier, a buffer, a comparator, or a filter. In some embodiments, the differential circuit is a pseudo-differential circuit.

In another embodiment, a differential circuit for processing signals within a signal band above a pre-determined frequency, the differential circuit includes a differential processor having a first input and a second input, the first input and second input forming a differential input, the differential processor having a bandwidth that includes frequencies above the pre-determined frequency; a biasing amplifier having a bias non-inverting input, a feedback inverting input, and a bias output; a voltage source electrically coupled to the bias non-inverting input; a feedback path electrically coupling the feedback inverting input to the bias output, such that the biasing amplifier presents a closed-loop output impedance at DC, and a second output impedance at frequencies above the predetermined frequency; a first biasing resistance having a first terminal and a second terminal, the first terminal electrically coupled to the bias output, and the second terminal electrically coupled to the first input; a second biasing resistance having a third terminal and a fourth terminal, the third terminal electrically coupled to the bias output, and the fourth terminal electrically coupled to the second input, the magnitude of the closed-loop output impedance at DC being less than ten percent of the lower of the magnitude of the first biasing resistance and the magnitude of the second biasing resistance, and the magnitude of the second output impedance being at least two hundred percent of the higher of the magnitude of the first biasing resistance and the magnitude of the second biasing resistance.

In some embodiments, the biasing amplifier has an open-loop output impedance of at least 1,000 ohms.

Some embodiments also include a source of a differential signal, the differential signal having a first component output and a second component output, the first component output electrically coupled to the first input, and the second component output electrically coupled to the second input.

Some embodiments also include a first coupling capacitor electrically coupled between the first component output and the first input, and a second coupling capacitor electrically coupled between the second component output and the second input, such that the first coupling capacitor and second coupling capacitor AC-couple the source from the differential processor.

Some embodiments also include a source of a pseudo-differential signal having a source signal output, the source signal output electrically coupled to the first input. In some embodiments, the second input is coupled to ground.

In another embodiment, a method for providing a bias voltage to a differential circuit configured to process signals at frequencies within a signal band above a pre-determined frequency, the differential circuit having a first signal input and a second signal input, the first signal input and second signal input together forming a differential node includes providing a bias source having a DC bias voltage output, the DC bias voltage output having a first output impedance at DC, and a second output impedance at frequencies within the signal band; providing a bias first resistance coupled between the bias voltage output and the first signal input so as to provide a DC bias voltage to the first signal input; and providing a second bias resistance coupled between the bias voltage output and the second signal input so as to provide the DC bias voltage to the second signal input, the magnitude of the first output impedance being less than 10 percent of the smaller of the first bias resistance and the second bias resistance, and the magnitude of the second output impedance being at least 200 percent of the larger of the first bias resistance and the second bias resistance.

In some embodiments, the differential circuit is an amplifier. In some embodiments, the differential circuit is a buffer. In some embodiments, the differential circuit is an intermediate stage of an amplifier, a buffer, or a comparator. In some embodiments, the differential circuit is a pseudo-differential amplifier. In some embodiments, the differential circuit is a comparator.

In another embodiment, a biasing circuit for providing bias voltage to a plurality of signal nodes in a differential circuit, which differential circuit is configured to process signals at frequencies above a pre-determined frequency within a signal band, the differential circuit having a first signal node and a second signal node, the first signal node and second signal node together forming a differential node, including a bias source having a DC voltage source, the DC voltage source producing a DC bias voltage, and an inductance having a first inductor terminal and a second inductor terminal, the first inductor terminal coupled to the DC voltage source; a first bias resistor having a first bias resistance, the first bias resistor coupled between the second inductor terminal and the first signal node so as to provide a DC bias voltage to the first signal node; and a second bias resistor having a second bias resistance, the second bias resistor coupled between the second inductor terminal and the second signal node so as to provide the DC bias voltage to the second signal node, such that the DC voltage output and the inductance form a bias source having a first output impedance at a DC, and a second output impedance within the signal band, the magnitude of the first output impedance being less than 10 percent of the smaller of the magnitude of the first bias resistance and the magnitude of the second bias resistance, and the magnitude of the second output impedance being at least 200 percent of the larger of the magnitude of the first bias resistance and the second bias resistance, provided that the magnitude of the first output impedance is less than the magnitude of the magnitude of the second output impedance.

In some embodiments, the circuit also includes a source of a differential signal having a first differential output and a second component output; a first coupling capacitor electrically coupled between the first component output and the first signal node, and a second coupling capacitor electrically coupled between the second component output and the second signal node, such that the first coupling capacitor and second coupling capacitor AC-couple the source from the differential processor.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Embodiments provide circuits and methods of providing an accurate, common-mode bias voltage to a differential signal path, while reducing the headroom requirements and the differential offset introduced, and some embodiments provide a reduced noise current, and/or reduced conversion from common-mode to differential-mode, and/or reduced conversion from differential-mode to common-mode, all without requiring the use of large resistors.

FIGS. 3A-3E schematically illustrate a circuit, and some properties of a circuit, including one embodiment of a bias source 320 providing a nominally identical DC bias voltage to both inputs 311 and 312 of a differential signal processor 310. In particular, the output 320A of bias source 320 is coupled to two bias resistances, 352A and 352B, which are, in turn, coupled to inputs 311 and 312 of a differential signal processor 310, respectively.

Figure 3A:
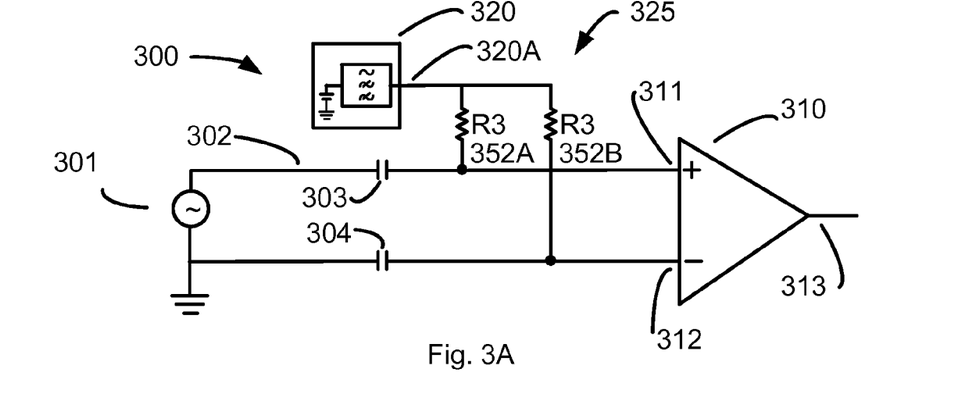
FIGS. 3A-3D schematically illustrate a biasing circuit and properties and models of a biasing circuit according to one embodiment.

The inventor has discovered that the operation of the differential signal processing circuit 300 may be enhanced if the bias source 320 has significantly different output impedance at different frequencies. More particularly, bias source 320 has a low output impedance at DC, and a high output impedance at frequencies within the signal band of circuit 300 (e.g., within the range of frequencies of the signal being processed by differential signal processor 310).

In some embodiments, bias source 320 has an output impedance magnitude of zero Ohms at DC, or a few Ohms at most. The practical limit for this low-frequency output impedance magnitude may be determined by a system designer according to the specifications of the system being designed, and/or according to the value of the bias resistors. For example, in some embodiments, an output impedance magnitude of 5 or 10 Ohms may be acceptable, and may therefore be considered to be "low" output resistance or impedance. Note that while examples of output impedance may be presented in terms of resistance, output impedance is not limited to pure resistance, and may include a reactive term.

Figure 3B:
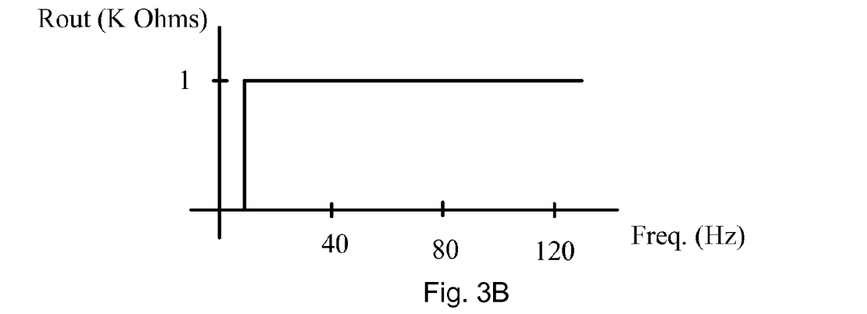
Figure 3C:
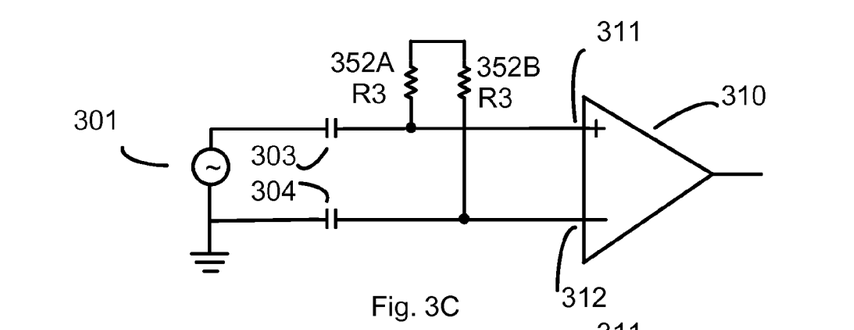

The output impedance magnitude of bias source 320 is considerably higher at higher frequencies, however. For example, the output impedance of one embodiment of an ideal bias source 320 is schematically illustrated in FIG. 3B. As shown, the output impedance magnitude of output 320A is at or near zero Ohms at frequencies below about 10 Hz, but jumps to about 1000 Ohms at about 10 Hz, and remains at about 1000 Ohms at frequencies above 10 Hz. Note that frequencies and impedances described above are merely illustrative, and various embodiments may vary those parameters, consistent with the principles described herein, to address the particular needs of a given design or signal processing task. In some embodiments, the output impedance of the bias source at various frequencies may be defined in terms of the ratio of that output impedance magnitude to another impedance magnitude within the circuit. For example, in some embodiments the output impedance of a bias source may be defined as a percentage of a bias resistance, such as a bias resistance coupled to the output of the bias source, for example.

A number of issues in prior art bias circuits arise from the bias resistors. Some such issues may be mitigated by the use of large bias resistances, but other issues are exacerbated by the use of large bias resistances. The output impedance characteristics described above provide a number of advantages over prior art biasing circuits, because they allow the use of relatively small bias resistances in a differential biasing circuit while still providing some of the benefits of larger resistances.

Noise

For example, it is known to address noise issues by the use of large resistances. Resistances, such as bias resistances 214A and 214B in circuit 210 for example, each generate noise current described by the following equation (where R3 is the resistance of the bias resistor):

$$i_n = \sqrt{4KT\Delta f \frac{1}{R_3}}$$

As can be seen from that equation, the input noise current varies inversely with the size of the bias resistor. As such, it is known in the prior art to make the bias resistors 214A, 214B as large as possible, so as to reduce input noise current. Large resistors may give rise to other problems, however.

When the circuits are implemented in an integrated circuit, practical resistances are limited by at least four factors: area, offset, common-mode accuracy, and headroom-loss.

Area

In terms of area, many semiconductor fabrication processes require large areas for high-resistance resistors; the greater the resistance, the more area required for the resistor. Since space is at a premium in most integrated circuits, this factor suggests the use of smaller resistances, if possible.

Offset and Common-Mode Accuracy

The bias resistances in a differential biasing circuit may contribute to errors in the form of offset voltage, with greater resistances contributing greater errors.

Taking circuit 210 in FIG. 2A as an example, non-null bias input currents at the inputs 212A, 212B of the differential or pseudo-differential circuit 212 result in an input-referred offset that is not eliminated by the AC-coupling capacitors 213A, 213B.

If the input currents, and/or the bias resistances are not equal, the resulting voltage drop across the bias resistances will not be equal, resulting in a difference (or error in the form of offset voltage).

Bias errors arise even if the bias resistances 212A and 212B and input currents are identical, however, since any voltage drop across the bias resistances 212A and 212B will introduce a difference between the intended bias voltage and the bias voltage actually supplied.

In each case, the greater the resistance the larger the voltage drop induced by the input bias current. As such, these concerns both suggest the use of small bias resistances.

Headroom Loss

In addition, the product of the input bias currents and the respective bias resistances can result into a voltage drop that exceeds, or at least consumes a portion of, the available headroom defined by supply and ground voltages—particularly, when the input bias is very close to the rails. For example, this problem is of particular concern when the bipolar low-noise amplifier (LNA) represented in FIG. 1B is implemented with a low supply because the input common-mode (base voltages) is very close the rail and low values of beta (temperature and/or process) can result into headroom problems for the resistors that commonly set this common mode. Again, this concern suggests the use of small bias resistances.

Mode Conversion

Yet another concern is errors introduced by differential-to-common-mode conversion and common-mode-to-differential conversion. It is known in the art that circuit properties, such impedance mismatches in a circuit for example, can result in the conversion of differential energy from a differential signal or pseudo-differential signal into common-mode energy and/or result in the conversion of common mode energy present in a differential signal or pseudo-differential signal into differential energy that gets added to differential or pseudo-differential signal. Such conversions between the common-mode and the differential modes can introduce severe errors in the signal processing. Consider the small signal equivalent circuit 270 in FIG. 2D, for example. Each of the resistors forms an RC filter with one of the capacitors. If the impedance of either of the resistors, or the capacitors, or both are not well matched, each of the RC filters will have a different frequency response. Accordingly, the components of a differential signal reaching the respective inputs of the amplifier 271 will convert some of the input common mode into a differential-mode signal and some of the input differential signal in to a common-mode signal. Therefore, this concern suggests that the resistors as well as the capacitors be well matched.

Prior art biasing circuits therefore present a paradox: a circuit that employs small bias resistances suffers input noise current, while a circuit that uses large bias resistances suffers from degraded offset voltage performance, degraded common-mode bias accuracy, and loss of headroom, in addition to requiring lots of real estate on an integrated circuit. Various embodiments address these issues by allowing the use of relatively small bias resistances, which behave as larger resistances for purposes of considering noise current. Additionally, these embodiments reduce the contribution that the resistors have to the mode conversion to a level smaller than would be attainable in the prior art.

Returning to circuit 300 in FIG. 3A, the bias circuit 325 (e.g., source 320 and bias resistors 352A and 352B) behaves much like prior art bias circuits at low (e.g., DC) frequencies. Indeed, for practical purposes, at low frequencies the circuit of FIG. 3A is electrically similar to the prior art circuit in FIG. 2A. The bias source 320 presents each resistor 352A, 352B with a low-impedance output, such that the output impedance of the bias source 320 has no meaningful effect on the bias voltage provided to the differential inputs 311 and 312 at DC.

Figure 3D:
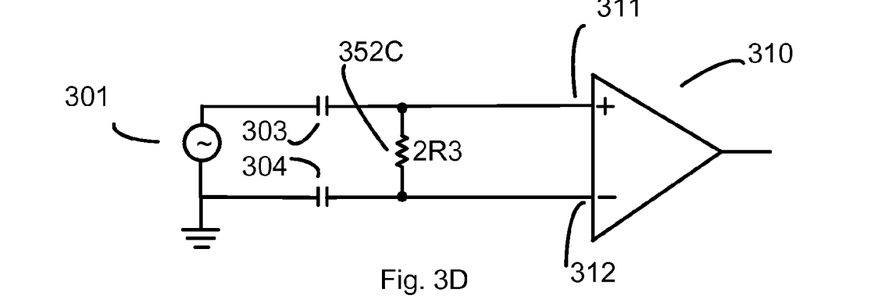

In contrast, at higher frequencies, the output impedance of bias source 320 is much higher than the resistance of bias resistors 352A and 352B. At such frequencies, the bias circuit is effectively reduced to the circuit schematically illustrated in FIG. 3C. As such, the bias resistors 352A and 352B are effectively in series—and therefore form one larger resistance 352C—between the non-inverting input 311 and inverting input 312 of amplifier 310, as schematically illustrated in FIG. 3D. Among other things, note that the bias resistors, shown here as the one larger resistance 352C, are not coupled to ground in this small signal equivalent 370. As such, this circuit does not suffer from, or at least does not suffer to the same degree, the mode conversion issues described in connection with the circuit in FIG. 2D when resistors 352A and 352B are mismatched.

Figure 3E:
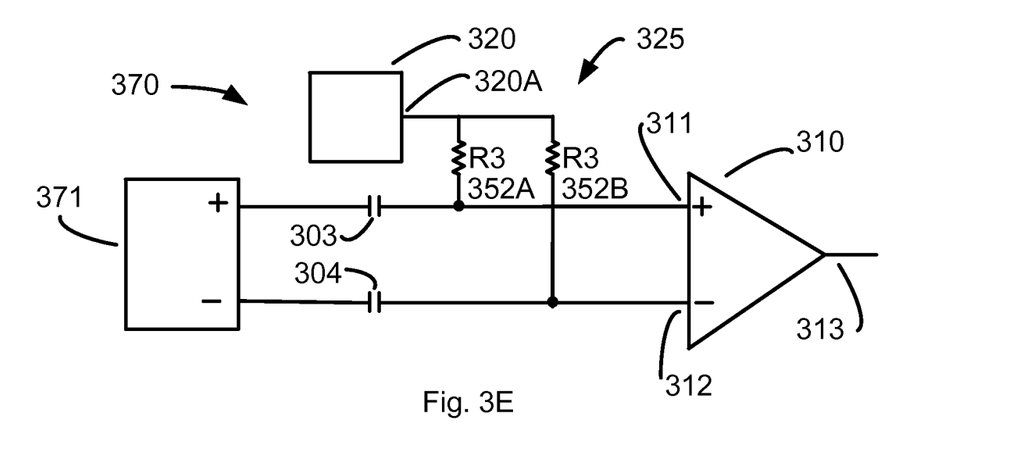
FIGS. 3E-3F schematically illustrate an embodiment of, and a model of, a biasing circuit according to another embodiment.
Figure 3F:
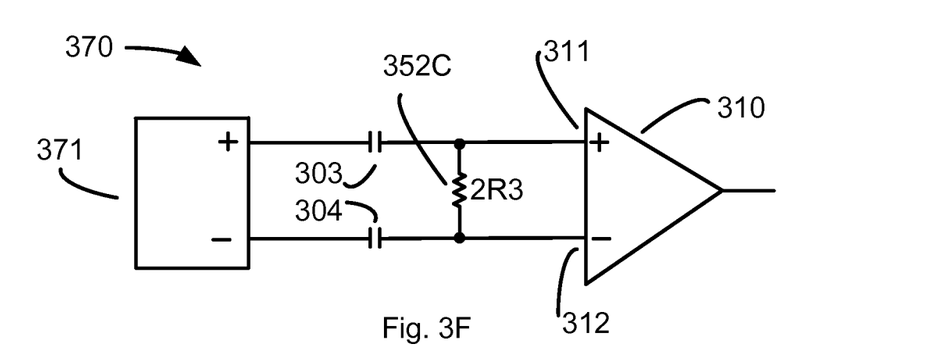

An alternate embodiment 370 is schematically illustrated in FIG. 3E, and has a fully differential signal source 371. A small signal equivalent circuit is schematically illustrated in FIG. 3F. This embodiment, and also does not suffer from, or at least does not suffer to the same degree, mode conversion issues when resistors 352A and 352B are mismatched.

As such, and in contrast to the prior art, the circuit schematically illustrated in FIG. 3A, and described above, provides improved operating characteristics, such as reduced noise, without the use of such large resistors.

Figure 4A:
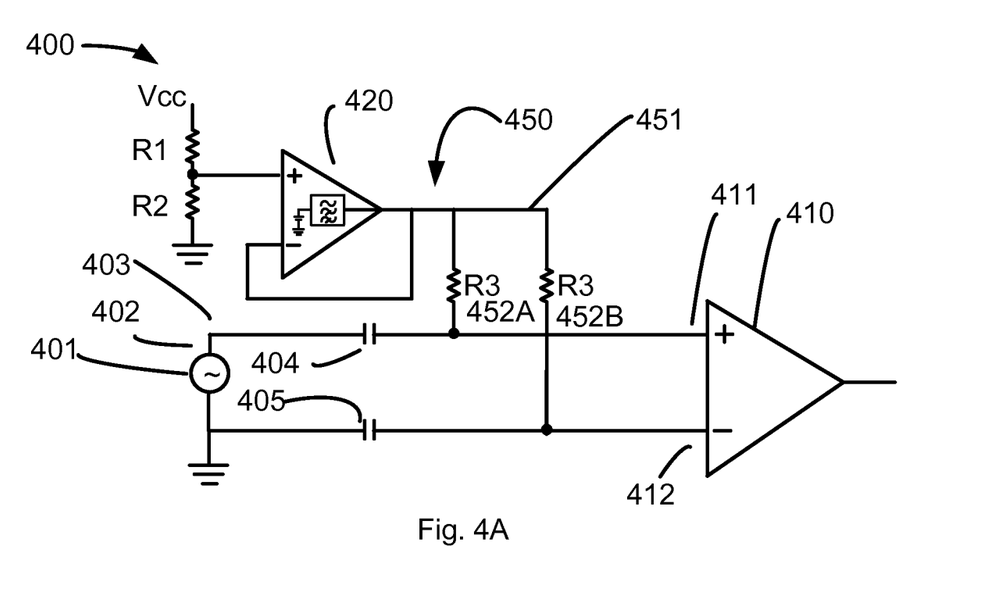
FIGS. 4A-4F schematically illustrate a biasing circuit, and properties of a biasing circuit, according to one embodiment.
Figure 4B:
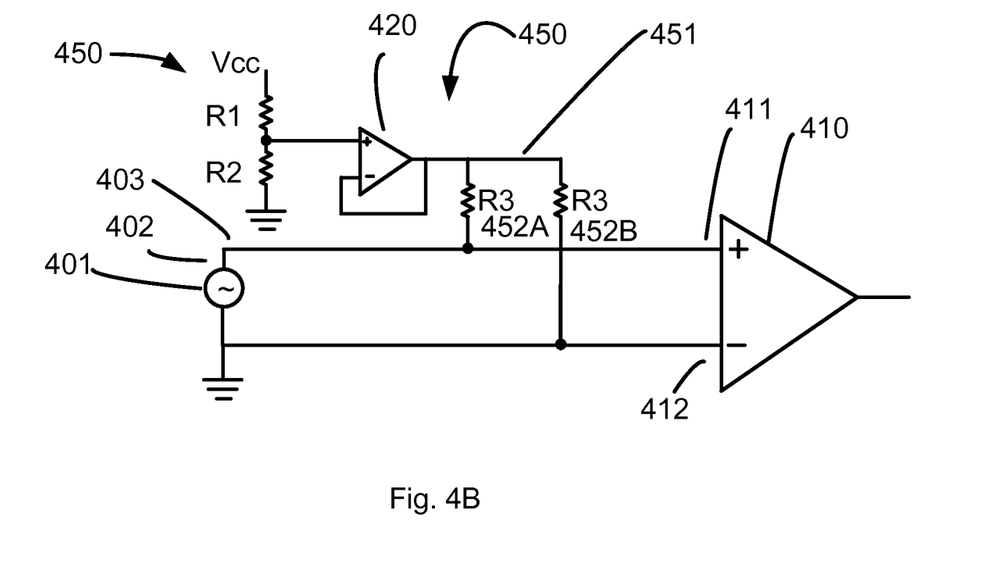

One embodiment of an AC-coupled circuit 400, including a bias circuit 450 with frequency-dependent output resistance, is schematically illustrated in FIG. 4A, and a similar circuit that is not AC-coupled is schematically illustrated in FIG. 4B. The circuit in FIG. 4A is discussed further below, with the understanding that the same description also applies to circuit 450 in FIG. 4B.

In this embodiment, a signal source 401 produces a pseudo-differential output signal 403 at its output 402. For purposes of illustration, the signal band 471 begins at 40 Hz.

Output 402 is, in turn, AC-coupled to processing circuit 410 by coupling capacitor 404. As such, any DC component of the output signal on terminal 402 is blocked from reaching processing circuit 410.

Bias circuit 450 then adds a common-mode bias voltage to the transducer signal 403 after it has passed through capacitors 404 and 405, by producing a bias voltage at node 451, and coupling node 451 to the non-inverting input 411 and inverting input 412 of amplifier 410.

In this embodiment, the bias source 420 is an active circuit that is similar to a common operational amplifier ("op-amp") in unity-gain configuration, in some respects, but with some distinct differences. In fact, some embodiments include an op-amp in unity-gain configuration, but such op-amps have loop gain of less than unity in the signal band and large open-loop DC output impedance.

Figure 4C:
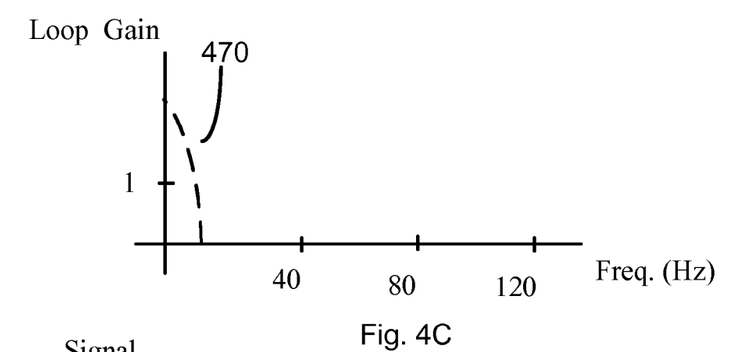
Figure 4D:
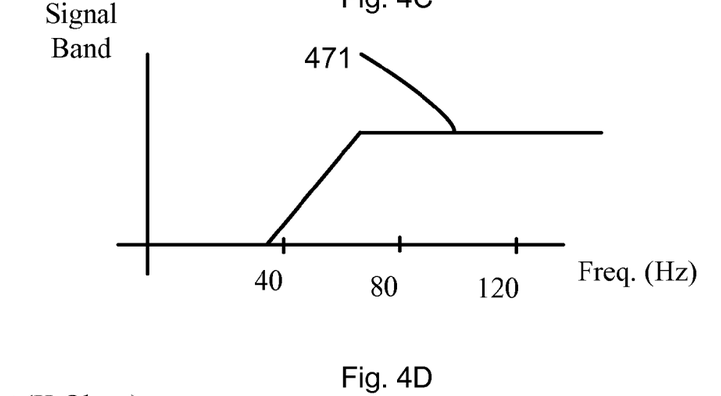

For example, it is known in the art that operational amplifiers are commonly designed to have a large open-loop gain, and a frequency response such that the loop gain is one or more within the frequency range of the signals to be processed (e.g., input signal 403) when used in a feedback configuration. In contrast, bias circuit 420 has a loop gain much lower than unity in the signal band. In this way, the effect of feedback within the signal band is attenuated, to help keep the output impedance high at those frequencies. Stated alternately, the loop gain of the bias amplifier 420 is less than unity at frequencies within the signal band (and indeed, may fall below unity at a frequency well below the lowest frequency within the signal band), as schematically illustrated in FIG. 4C and FIG. 4D. In other words, bias circuit 420 has very large loop gain at DC, but low loop gain at frequencies within the signal band of the signal being processed.

Figure 4E:
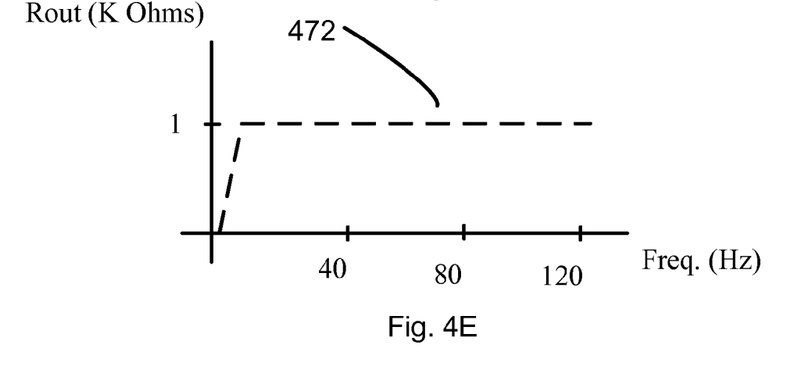

As another example, it is known in the art that operational amplifiers are commonly designed to have low output impedance over a broad frequency range, such as within their signal band. In particular, operational amplifiers commonly have low open-loop output resistance, and even lower closed-loop output resistance at the frequencies within range of the signal to be processed. In contrast, bias source 420 has a low output impedance only at low frequencies (e.g., DC). In particular, bias source 420 has a low output impedance only at frequencies that are outside the signal band of amplifier 410. In other words, bias source 420 has a high output impedance in the signal band, as schematically illustrated in FIG. 4E. For example, within the frequency band of input signal 403, bias circuit 420 has an output impedance much larger than the resistance (R3) of bias resistors 452A and 452B. In some embodiments, bias circuit 420 may have an output impedance with a magnitude of 1000 Ohms, 10,000 Ohms, or even 1,000,000 Ohms or more, but a closed-loop resistance of one Ohm or less at DC. However, various embodiments may have different impedances, or impedances that are specified as a ratio of output impedance to bias resistance, or expressed in percentages of the magnitudes of such impedances.

In summary, bias source 420 violates some of the critical parameters of op-amp circuits. Indeed, bias source 420 would not be appropriate for use in processing signals within the signal band. As such, the use of bias circuit 420 in a circuit for processing signals within a desired frequency band is counterintuitive.

However, the counterintuitive characteristics of bias source 420 provide the output impedance vs. frequency characteristics generally described in connection with FIG. 3B, as well as FIG. 4E. Specifically, the resistance from node 451 to AC ground is radically different at DC (very low frequencies) than at the signal band frequencies. The low DC resistance results in reduced DC-point inaccuracy. The very high AC resistance at the signal band frequencies significantly improves the noise and conversion between differential and common-mode signals because the equivalent small-signal circuit at the signal frequencies now becomes that circuit depicted in FIG. 3D. The headroom-loss can be reduced because the improvement in noise and mode conversion allow the use of smaller resistors.

A number of observations about circuit 400 may be noted. First, the total noise current contributed by the resistors 452A and 452B, each of which has a resistance of "R3" Ohms, is:

$$i_n \approx \sqrt{4KT\Delta f \frac{1}{2R_3}} = \frac{1}{\sqrt{2}} \sqrt{4KT\Delta f \frac{1}{R_3}}$$

This is approximately 1.4 times smaller than the noise current of the circuit 210 in FIG. 2A, if resistors of the same value are used.

Alternately, if the noise current of circuit 210 is acceptable in a given application, that level of noise current may be maintained through the use of smaller resistors with the application of bias source 420, thus saving space in an integrated circuit and reducing the headroom loss and DC-point inaccuracy.

In addition, mismatch between the resistance of resistors 452A and 452B no longer contributes (or no longer contributes as significantly) to the conversion between differential and common-mode signals, as was the case in some prior art circuits. In addition, the common-mode bias accuracy and the headroom loss for bias source 420 due to the input bias current are improved because of the reduction of the voltages dropped across the reduced-resistance bias resistors 452A and 452B. The beneficial qualities of the circuit 400 may be illustrated with a specific example, in which the amplifier 410 is a bipolar-input amplifier processing a pseudo-differential signal from source 401. A common-mode bias is established by coupling each of the amplifier inputs 411 and 412 to a bias voltage source 420 via resistors 452A and 452B, respectively, as schematically illustrated in FIG. 4A. The resistors ideally have an identical resistance of R3. In this circuit, assume that the nominal base current (i.e., the base current for the bipolar transistors at the inputs) for each of the inputs 411 and 412 is nominally, 5 micro Amperes, but that the worst-case is 20 micro Amperes. Assume further that that there is a 4.3 percent mismatch in those base currents.

For purposes of this example, assume that the circuit's specification imposes a 0.5 mV limit for the contribution to the input-referred offset from the mismatch among the two base currents.

The minimum resistance value (R3) of resistors 452A and 452B, respectively, may then be calculated as follows (using the worst-case for base current):

$$R3 \le \frac{Vos}{(\Delta\beta) \cdot ib, \max} = \frac{0.5 \text{ mV}}{4.3\% \cdot 20 \text{ } \mu A} = 581\Omega$$

Thus, the minimum value of resistors 452A and 452B is 581 Ohms.

This illustrates how demanding targets in input-referred offset and a widely varying beta require the use of small input-common-mode bias resistors, which increases the input noise current. In particular, the noise current power contributed at each of the amplifier inputs by the R3 bias resistors is:

$$i_{n,R}^2 = 4KT\Delta f \frac{1}{R_3}$$

The noise current power contributed at each of the amplifier inputs by the nominal base current is:

$$i_{n,BJT}^2 = 2q\Delta f \cdot i_{bnom}$$

The total noise current power can be computed as:

$$i_{n,TOT}^2 = i_{n,R}^2 + i_{n,BJT}^2$$

Figure 4F:
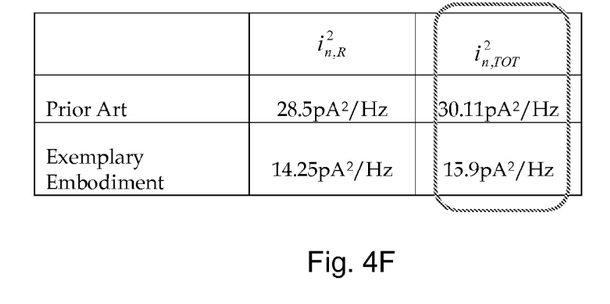

As such, the benefit of various embodiments is illustrated by the comparison between the noise current powers as summarized in FIG. 4F, which demonstrates a reduction in the total input-referred noise-current power by a factor of nearly 2.

Various embodiments are not limited to the circuits and systems described above. Indeed, embodiments are not limited to application at the input of an amplifier or buffer.

Figure 5:
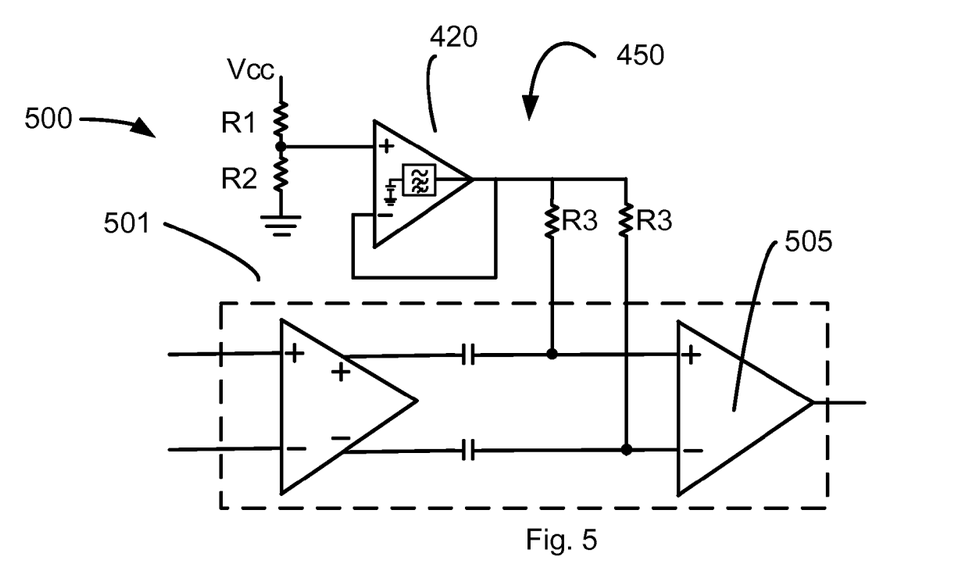
FIG. 5 schematically illustrates an embodiment of a biasing circuit.

For example, an alternate embodiment 500 is schematically illustrated in FIG. 5, in which bias circuit 450, which has bias source 420 that provides bias to an intermediate stage 505 of amplifier 501.

Figure 6:
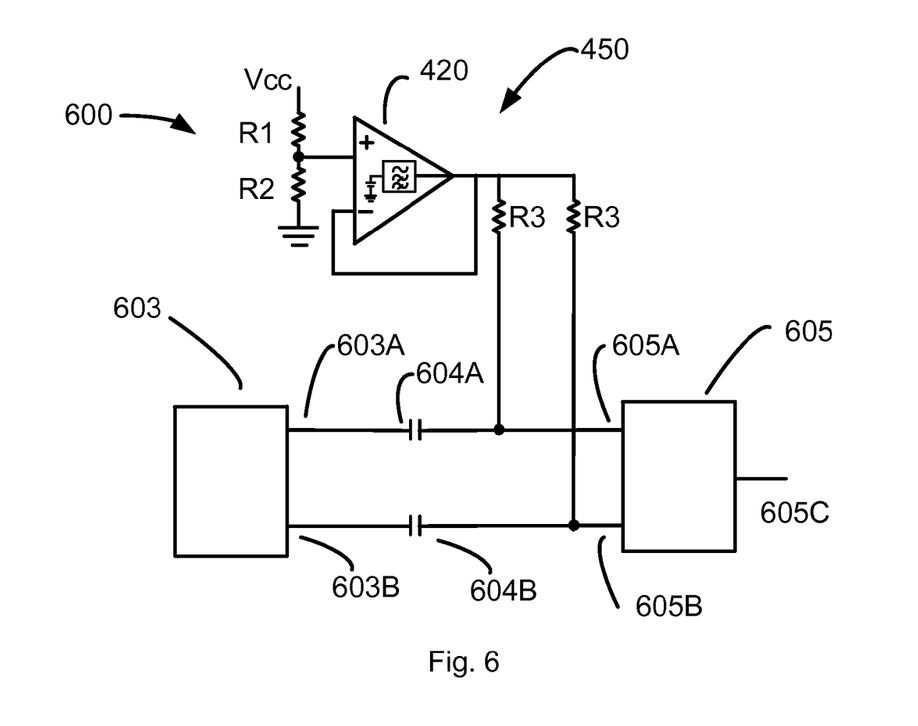
FIG. 6 schematically illustrates an embodiment of a biasing circuit.

More generally, some embodiments are schematically illustrated by circuit 600 in FIG. 6. Circuit 600 includes a source 603 of a pseudo-differential or differential signal having two component outputs 603A and 603B. Outputs 603A and 603B are AC-coupled (but could be directly coupled, or coupled through other circuit elements in various embodiments) to in inputs 605A and 605B, respectively, of differential circuit 605 by capacitors 604A and 604B, respectively.

Signal source 603 may be any of a variety of signal sources, such a single-ended transducer 301 connected as shown in FIG. 3A, or any other source of a pseudo-differential or differential input signal.

Differential circuit 605 may also be any of a variety of differential circuits, including amplifiers, buffers, and comparators, to name but a few. In addition, differential circuit 605 may have a single-ended output 605C, as shown in FIG. 6, or a differential output. Indeed, in some embodiments, differential circuit 605 may have a differential output, and may constitute a differential signal source (e.g., 603) for a subsequent stage of the circuit.

Figure 7:
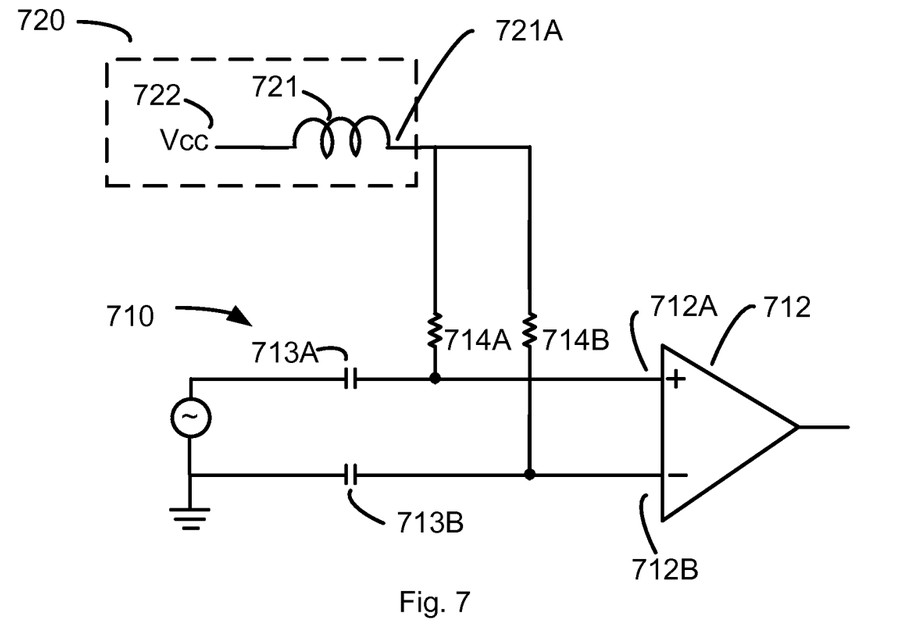
FIG. 7 schematically illustrates an embodiment of a biasing circuit.

An alternate embodiment is schematically illustrated in FIG. 7. In this embodiment, a bias voltage source 720 has a power source 722, which outputs a DC bias voltage, and an inductor 721, configured such that the inductor 721 is coupled between power source 722 and bias resistors 714A and 714B. In this embodiment, one terminal 721A of the inductor 721 is electrically coupled to both of the inputs 712A, 712B of amplifier 712 through resistances 714A and 714B. In other words, 712A, 712B of amplifier 712 share a single, common bias inductor 721.

The inductor 721 effectively creates the output impedance of the bias voltage source 720. The values of the inductor 721 and bias resistors 714A and 714B are such the effective output impedance of bias voltage source 720 is zero, or near zero, at DC, but its magnitude is greater than the resistance of the lowest of the bias resistors 714A and 714B within the signal band, as with embodiments described above. In various embodiments, the power source 720 may include a variety of voltage providers, such a DC power supply, a voltage divider, or an active circuit, to name but a few.

A wide variety of variations may be implemented in various embodiments, provided that the output impedance of the bias source is lower than the bias resistors at DC, and higher at frequencies in the signal band. In general, the higher the output impedance in the signal band, the greater the benefit.

Figure 8A:
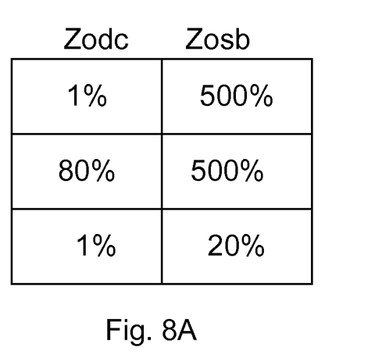
FIGS. 8A-8B are tables of data representing various impedances for bias circuit elements at DC and signal band frequencies.
Figure 8B:
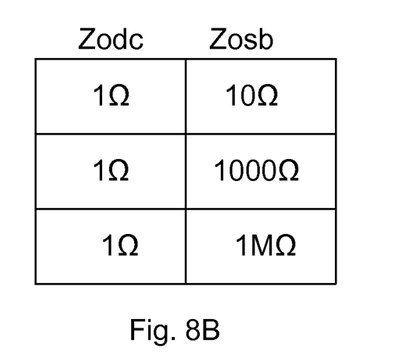

In some embodiments, the relationship between the output impedance of the bias source (at DC and at the signal band) and the bias resistances may be expressed in terms of their magnitudes. For example, in one embodiment, the DC output impedance may be 1 percent of the lowest of the bias resistances, while the output impedance within the signal band may be five hundred percent of the highest of the bias resistances. This, and other exemplary variations, are shown in a table in FIG. 8A, in which Zodc represents the magnitude of the output impedance of the bias voltage source at DC as a percentage of the lowest bias resistance, and Zosb represents the magnitude of the output impedance of the bias voltage source within the signal band as a percentage of the highest bias resistance. An alternate expression is shown in FIG. 8B, in which Zodc represents the output impedance of the bias voltage source at DC in Ohms, and Zosb represents the output impedance of the bias voltage source within the signal band in Ohms. Various embodiments may show a wide variation in Zodc and Zosb, but have a common characteristic in that the Zosb is much greater than Zodc. In some embodiments, Zosb is greater than the larger of the bias resistances, but some embodiments may have a Zosb that is less than one or both of the bias resistors, provided that Zodc is much smaller than Zosb. In some embodiments, the magnitude of Zodc may be less than fifty percent of the magnitude of the Zosb, while in other embodiments Zodc may be less than forty percent of the magnitude of the Zosb, while in other embodiments Zodc may be less than thirty percent of the magnitude of the Zosb, while in other embodiments Zodc may be less than twenty percent of the magnitude of the Zosb, while in other embodiments Zodc may be less than ten percent or less of the magnitude of the Zosb. Alternately, Zosb may be expressed by the ratio of its impedance to the impedance of Zodc. For example, in some embodiments, Zosb may 2 times Zodc, while in some embodiments Zosb may 5 times Zodc, or 10 times, 100 times, 1,000 times or 1,000,000 or more times Zodc.

DEFINITIONS

As used in this description and the accompanying claims, the following terms shall have the meanings indicated, unless the context otherwise requires:

A differential signal is a signal having two component signals such that information carried by the signal is represented as the difference between the two component signals. In general, the common mode of the two component signal (or common-mode) is nominally independent of the information being carried.

A pseudo differential signal is a signal having two component signals such that the information is encoded by the difference between the two component signals and such that the common mode of the two component signals (or common-mode) is nominally dependent on the encoded information. For example, a pseudo-differential signal may be composed of a first component signal that is nominally constant and a second component signal that contains the information to be encoded; in this case, the difference between the two component signals encodes the information and the common mode of the two component signals equals half of the difference between the component signals, and, therefore, nominally depends on the encoded information.

A differential circuit is a circuit that processes the difference of two component signals. A differential circuit may include one or more modules, each of which can process the difference between two component signals, and each of which may be known as a differential processor. Therefore, the signals at the input, within, or at the output of the circuit can be differential or pseudo-differential. The circuit structure may be such that, in addition to processing the difference of the component signals, the circuit may also process the common mode of the component signals in some or all the portions of the circuit (as in a pseudo-differential circuit, for example). One example of a differential circuit is a circuit in which an amplifier is used to amplify or buffer a differential signal.

A "differential input" is a set of terminals or nodes in a differential circuit that together form an input to a differential circuit, or to a stage of a differential circuit, for the receipt of the component signals of a differential signal or a pseudo-differential signal. For example, a differential input may have a first terminal node for receipt of one component of a differential or pseudo-differential signal, and a second terminal node for receipt of the other component of a differential or pseudo-differential signal. Such a two-terminal pair may also be referred to as a "differential node." As such, a "differential input" is not limit to the entry point of an input stage of a circuit, but in some embodiments may be another differential node within a circuit.

The "signal band" of a signal is the range of non-zero frequencies within a differential or pseudo-differential signal being processed by, or passing through, a differential circuit. The "signal band" of a circuit is the range of non-zero frequencies that the circuit can process. In some embodiments, the signal band may be defined as all frequencies above a predetermined, non-zero frequency, and still within the bandwidth of the differential circuit. For example, if the differential circuit is an amplifier (or other linear circuit), the lower end of the signal band may be a predetermined frequency, and the upper end of the signal band may be defined as a higher frequency, or as a frequency at which amplifier's output is reduced to its −3 dB point, or as a frequency at which the amplifier's response to a linear input signal becomes non-linear, to name but a few examples. As another example, the signal band of a linear circuit may be the range of frequencies for which the circuit's response is linear. For a non-linear circuit, the signal band may be defined as a range of non-zero frequencies at which the circuit is specified to perform its non-linear function (e.g., if the circuit is a comparator, the signal band may be defined as the range of non-zero frequencies for which the comparator is specified to perform its comparison function; for a mixer, the signal band may be defined as the range of non-zero frequencies for which the mixer is specified to perform is mixing function).

A given bias circuit may have characteristics that are different at frequencies within the signal band than at frequencies outside the signal band. For example, a bias circuit that provides a common-mode bias voltage to nodes in a differential signal processor may have low output impedance at frequencies outside the signal band of the signal being processed by the differential signal processor, or outside the signal band of the differential signal processor itself, but high output impedance at frequencies within such a signal band. Similarly, an AC-coupled amplifier may pass signals at frequencies within the signal band, but block or reject signals at frequencies outside the signal band, such as DC for example.

The embodiments described above are intended to be merely exemplary; numerous variations and modifications will be apparent to those skilled in the art. All such variations and modifications are intended to be within the scope of the present inventions as defined in any appended claims. For example, but without limiting the generality of the foregoing, a resistance illustrated as a single resistor could, in various embodiments, include a number of resistances is parallel or series. Similarly, although various embodiments illustrate and describe bias resistors are coupling directly to the terminals or nodes of a differential or pseudo-differential circuit, such circuits could include other elements between the bias source and the terminals or nodes of a differential or pseudo-differential circuit. Also, although various embodiments illustrate and describe signal sources as single ended sources, various embodiments may process fully differential signals and/or pseudo-differential circuits. In addition, although some embodiments have a bias-source with a feedback loop having a loop gain within the signal band that is less than unity, various embodiments may have a bias-source with a feedback loop having a loop gain within the signal band that is equal to or greater than unity within the signal band, provided that the output impedance of the bias source at DC is less than the output impedance within the signal band, consistent with the parameters described above.

What is claimed is:

1. A biasing circuit for providing bias voltage to a differential circuit configured to process signals at frequencies above a pre-determined frequency within a signal band, the differential circuit having a first signal node and a second signal node, the first signal node and second signal node together forming a differential node, the biasing circuit comprising:
  a bias source having a DC voltage output, the DC voltage output producing a DC bias voltage and having:
    a first output impedance at DC, and
    a second output impedance at frequencies within the signal band;
  a first bias resistor having a first bias resistance, the first bias resistor coupled between the DC voltage output and the first signal node so as to provide the DC bias voltage to the first signal node; and
  a second bias resistor having a second bias resistance, the second bias resistor coupled between the DC voltage output and the second signal node so as to provide the DC bias voltage to the second signal node,
  wherein the magnitude of the first output impedance being less than 80 percent of the smaller of the magnitude of the first bias resistance and the magnitude of the second bias resistance, and
  the magnitude of the second output impedance being at least 20 percent of the larger of the magnitude of the first bias resistance and the magnitude of the second bias resistance, provided that the magnitude of the first output impedance is less than fifty percent of the magnitude of the second output impedance.

2. The biasing circuit of claim 1, wherein the differential circuit is an amplifier.

3. The biasing circuit of claim 1, wherein the differential circuit is a buffer.

4. The biasing circuit of claim 1, wherein the differential circuit is an intermediate stage of an amplifier, a buffer, or a comparator.

5. The biasing circuit of claim 1, wherein the differential circuit is a pseudo-differential circuit.

6. The biasing circuit of claim 1, wherein the differential circuit is a comparator.

7. A differential circuit for processing signals within a signal band above a pre-determined frequency, the differential circuit comprising:
 a differential processor having a first input and a second input, the first input and second input comprising a differential input, the differential processor having a bandwidth that includes frequencies above the pre-determined frequency;
 a biasing amplifier having a bias non-inverting input, a feedback inverting input, and a bias output;
 a voltage source electrically coupled to the bias non-inverting input;
 a feedback path electrically coupling the feedback inverting input to the bias output, such that the biasing amplifier presents a closed-loop output impedance at DC, and a second output impedance at frequencies above the predetermined frequency;
 a first biasing resistance having a first terminal and a second terminal, the first terminal electrically coupled to the bias output, and the second terminal electrically coupled to the first input;
 a second biasing resistance having a third terminal and a fourth terminal, the third terminal electrically coupled to the bias output, and the fourth terminal electrically coupled to the second input,
 wherein the magnitude of the closed-loop output impedance at DC being less than ten percent of the lower of the magnitude of the first biasing resistance and the magnitude of the second biasing resistance, and
 the magnitude of the second output impedance being at least two hundred percent of the higher of the magnitude of the first biasing resistance and the magnitude of the second biasing resistance.

8. The differential circuit of claim 7, wherein the biasing amplifier has an open-loop output impedance of at least 1,000 ohms.

9. The differential circuit of claim 7, further comprising a source of a differential signal, the differential signal having a first component output and a second component output, the first component output electrically coupled to the first input, and the second component output electrically coupled to the second input.

10. The differential circuit of claim 9, further comprising a first coupling capacitor electrically coupled between the first component output and the first input, and a second coupling capacitor electrically coupled between the second component output and the second input, such that the first coupling capacitor and second coupling capacitor AC-couple the source from the differential processor.

11. The differential circuit of claim 7, further comprising a source of a pseudo-differential signal having a source signal output, the source signal output electrically coupled to the first input.

12. The differential circuit of claim 11, wherein the second input is coupled to ground.

13. A method for providing a bias voltage to a differential circuit configured to process signals at frequencies within a signal band above a pre-determined frequency, the differential circuit having a first signal input and a second signal input, the first signal input and second signal input together comprising a differential node, the method comprising:
 providing a bias source having a DC bias voltage output, the DC bias voltage output having:
  a first output impedance at DC, and
  a second output impedance at frequencies within the signal band;
 providing a bias first resistance coupled between the DC bias voltage output and the first signal input so as to provide a DC bias voltage to the first signal input; and
 providing a second bias resistance coupled between the DC bias voltage output and the second signal input so as to provide the DC bias voltage to the second signal input,
 wherein the magnitude of the first output impedance being less than 10 percent of the smaller of the first bias resistance and the second bias resistance, and
 the magnitude of the second output impedance being at least 200 percent of the larger of the first bias resistance and the second bias resistance.

14. The biasing circuit of claim 13, wherein the differential circuit is an amplifier.

15. The biasing circuit of claim 13, wherein the differential circuit is a buffer.

16. The biasing circuit of claim 13, wherein the differential circuit is an intermediate stage of an amplifier, a buffer, or a comparator.

17. The biasing circuit of claim 13, wherein the differential circuit is a pseudo-differential amplifier.

18. The biasing circuit of claim 13, wherein the differential circuit is a comparator.

19. A biasing circuit for providing bias voltage to a plurality of signal nodes in a differential circuit, which differential circuit is configured to process signals at frequencies above a pre-determined frequency within a signal band, the differential circuit having a first signal node and a second signal node, the first signal node and second signal node together forming a differential node, the biasing circuit comprising:
 a bias source having:
  a DC voltage source, the DC voltage source producing a DC bias voltage, and
  an inductance having a first inductor terminal and a second inductor terminal, the first inductor terminal coupled to the DC voltage source;
 a first bias resistor having a first bias resistance, the first bias resistor coupled between the second inductor terminal and the first signal node so as to provide the DC bias voltage to the first signal node; and
 a second bias resistor having a second bias resistance, the second bias resistor coupled between the second inductor terminal and the second signal node so as to provide the DC bias voltage to the second signal node,
 such that the DC voltage source and the inductance form a bias source having a first output impedance at a DC, and a second output impedance within the signal band,
 wherein the magnitude of the first output impedance being less than 10 percent of the smaller of the magnitude of the first bias resistance and the magnitude of the second bias resistance, and
 the magnitude of the second output impedance being at least 200 percent of the larger of the magnitude of the first bias resistance and the second bias resistance, provided that the magnitude of the first output impedance is less than the magnitude of the magnitude of the second output impedance.

20. The biasing circuit of claim 19, further comprising:

a source of a differential signal having a first differential output and a second component output;

a first coupling capacitor electrically coupled between the first component output and the first signal node, and a second coupling capacitor electrically coupled between the second component output and the second signal node, such that the first coupling capacitor and second coupling capacitor AC-couple the source from the differential circuit.

* * * * *